(12) United States Patent
Lv (10) Patent No.: US 11,805,668 B2
(45) Date of Patent: Oct. 31, 2023

(54) DISPLAY SUBSTRATE INCLUDING CLOSED ANNULAR STRUCTURES SURROUNDING DISPLAY REGION TO REDUCE CRACKING

(71) Applicants: Chengdu BOE Optoelectronics Technology Co., Ltd., Sichuan (CN); BOE Technology Group Co., Ltd., Beijing (CN)

(72) Inventor: Haoming Lv, Beijing (CN)

(73) Assignees: CHENGDU BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 230 days.

(21) Appl. No.: 16/879,830

(22) Filed: May 21, 2020

(65) Prior Publication Data

US 2020/0287163 A1    Sep. 10, 2020

Related U.S. Application Data (63) Continuation-in-part of application No. PCT/CN2019/079620, filed on Mar. 26, 2019.

(30) Foreign Application Priority Data

Apr. 3, 2018  (CN) .......................... 201810291817.7

(51) Int. Cl.
*H10K 50/844* (2023.01)
*H10K 50/115* (2023.01)
(Continued)

(52) U.S. Cl.
CPC ......... *H10K 50/844* (2023.02); *H10K 50/115* (2023.02); *H10K 59/131* (2023.02); *H10K 71/00* (2023.02); *H10K 59/1201* (2023.02)

(58) Field of Classification Search
CPC .............. H01L 51/5253; H01L 51/502; H01L 51/5237; H01L 51/524; H01L 51/5243;
(Continued)

(56) References Cited

U.S. PATENT DOCUMENTS

| 10,135,020 B1 | 11/2018 | Zhang et al. |
| 2009/0134399 A1 | 5/2009 | Sakakura et al. |
| 2015/0036299 A1 | 2/2015 | Namkung et al. |
| 2015/0255740 A1* | 9/2015 | Nakada ............... H01L 51/5243 257/40 |

(Continued)

FOREIGN PATENT DOCUMENTS

| CN | 101344696 A | 1/2009 |
| CN | 101630078 A | 1/2010 |

(Continued)

OTHER PUBLICATIONS

Extended European search report of counterpart EP application No. 19780622.7 dated Nov. 12, 2021.
(Continued)

*Primary Examiner* — Matthew E. Gordon
(74) *Attorney, Agent, or Firm* — Lippes Mathias LLP (57) ABSTRACT

A display substrate is provided. The display substrate has a display region and a non-display region disposed around the display region and the display substrate includes a base substrate and a barrier structure disposed on a side of the base substrate. The barrier structure is disposed in the non-display region, and the barrier structure includes a metal structure and a protective layer which are arranged on the substrate in sequence and the protective layer covers the metal structure.

14 Claims, 6 Drawing Sheets

(51) Int. Cl.
  *H10K 59/131* (2023.01)
  *H10K 71/00* (2023.01)
  *H10K 59/12* (2023.01)
(58) Field of Classification Search
  CPC ............. H01L 51/5246; H01L 51/56; H01L 27/3276; H10K 50/115; H10K 50/844; H10K 59/12; H10K 59/131; H10K 59/1201; H10K 71/00; H10K 71/40; H10K 71/421; H10K 71/441
  USPC .......................................................... 257/40
  See application file for complete search history.

(56) References Cited

U.S. PATENT DOCUMENTS

| | | | |
|---|---|---|---|
| 2015/0311409 A1* | 10/2015 | Huang | G02F 1/1333 257/99 |
| 2016/0285044 A1 | 9/2016 | Park et al. | |
| 2017/0117502 A1 | 4/2017 | Park | |
| 2018/0026225 A1 | 1/2018 | Kwon et al. | |

FOREIGN PATENT DOCUMENTS

| | | |
|---|---|---|
| CN | 104216153 A | 12/2014 |
| CN | 106992263 A | 7/2017 |
| CN | 107017277 A | 8/2017 |
| CN | 107393906 A | 11/2017 |
| CN | 107658386 A | 2/2018 |
| CN | 107863357 A | 3/2018 |
| CN | 108508643 A | 9/2018 |
| KR | 20020056683 A | 7/2002 |
| KR | 20160114251 A | 10/2016 |
| WO | WO2012138903 A2 | 10/2012 |

OTHER PUBLICATIONS

Decision of Rejection of Chinese application No. 201810291817.7 dated Dec. 30, 2020.
Notification on Results of Estimation of Patentability of Invention of Russian application No. 2020120964/28 dated Dec. 17, 2020.
Russian Search Report of Russian application No. 2020120964/28 dated Dec. 16, 2020.
Examination report of Australian application No. 2019250004 dated Nov. 27, 2020.
International search report of PCT application No. PCT/CN2019/079620 dated Jul. 2, 2019.
First office action of Chinese application No. 201810291817.7 dated Sep. 17, 2019.
Notice of Reasons for Refusal of Japanese application No. 2020-533780 dated Mar. 6, 2023.

* cited by examiner

DISPLAY SUBSTRATE INCLUDING CLOSED ANNULAR STRUCTURES SURROUNDING DISPLAY REGION TO REDUCE CRACKING

This application is a continuation-in-part of PCT/CN2019/079620, filed on Mar. 26, 2019, which claims priority to Chinese Patent Application No. 201810291817.7, filed Apr. 3, 2018, both of which are fully incorporated by reference herein.

TECHNICAL FIELD

The present disclosure relates to the field of display technologies, and more particularly to a display substrate, a method for manufacturing same, a display panel and a display apparatus.

BACKGROUND

Display substrates are products in the technical field of display that are capable of proactively emitting light or passively emitting light.

SUMMARY

The present disclosure provides a display substrate, method for manufacturing same, display panel and display apparatus.

In one aspect, there is provided a display substrate having a display region and a non-display region disposed around the display region, the display substrate includes:
 a base substrate and a barrier structure disposed on a side of the base substrate, wherein the barrier structure is disposed in the non-display region, and the barrier structure includes a metal structure and a protective layer which are arranged on the substrate in sequence and the protective layer covers the metal structure.

Optionally, the metal structure includes at least one closed annular structure, and each of the at least one closed annular structure surrounds the display region.

Optionally, the metal structure includes a plurality of closed annular structures (021) arranged at intervals.

Optionally, the plurality of closed annular structures are arranged at equal intervals.

Optionally, the non-display region includes a first annular region and a second annular region that respectively surround the display region, and the first annular region is sleeved to a side of the second annular region distal from the display region; and
 the metal structure is disposed in the first annular region, and a gap exists between the barrier structure and a film layer structure disposed in the second annular region.

Optionally, the display substrate further includes a conductive structure disposed in the second annular region;
 wherein the metal structure and the conductive structure are disposed on the same layer, and a preparation material of the metal structure is as same as that of the conductive structure.

Optionally, the conductive structure includes a gate wiring; and
 the metal structure and the gate wiring are disposed on the same layer, and the preparation material of the metal structure is as same as that of the gate wiring.

Optionally, a preparation material of the metal structure includes at least one of molybdenum, titanium, aluminum and silver.

Optionally, the display substrate is an organic light emitting diode (OLED) display substrate or a quantum dot light emitting diode (QLED) display substrate.

In another aspect, there is provided a method for manufacturing a display substrate, the display substrate having a display region and a non-display region disposed around the display region, the method including:
 providing a base substrate; and
 forming a metal structure in the non-display region on the base substrate with a metal material.
 forming a protective layer in the non-display region on the base substrate having a formed metal structure for causing the protective layer to cover the metal structure.

Optionally, forming the metal structure in the non-display region on the base substrate with a metal material includes:
 forming at least one closed annular structure in the non-display region on the base substrate with the metal material and by a patterning process, wherein each of the at least one closed annular structure surrounds the display region.

Optionally, forming at least one closed annular structure in the non-display region on the base substrate with the metal material and by the patterning process includes:
 forming a plurality of closed annular structures arranged at intervals in the non-display region on the base substrate with the metal material and by the patterning process.

Optionally, the non-display region includes a first annular region and a second annular region that respectively surround the display region, and the first annular region is sleeved to a side of the second annular region distal from the display region; and
 forming the metal structure in the non-display region on the base substrate with a metal material includes:
 forming the metal structure in the first annular region on the base substrate and forming a conductive structure in the second annular region on the base substrate with the metal material and by a one-patterning process, wherein a gap exists between the barrier structure and the conductive structure.

Optionally, forming the metal structure in the first annular region on the base substrate and forming the conductive structure in the second annular region on the base substrate with the metal material and by the one-patterning process includes:
 forming the metal structure in the first annular region on the base substrate and forming a gate wiring in the second annular region on the base substrate with the metal material and by the one-patterning process, wherein a gap exists between the metal structure and the gate wiring.

Optionally, forming the metal structure in the non-display region on the base substrate with the metal material includes:
 forming the metal structure in the non-display region on the base substrate with at least one of molybdenum, titanium, aluminum and silver and by the patterning process.

Optionally, a width of the at least one closed annular structure ranges from 5 μm to 15 μm, and a height of the at least one closed annular structure in a direction vertical to the base substrate ranges from 10 μm to 20 μm.

Optionally, a preparation material of the protective layer comprises polyimide.

Optionally, the non-display region includes a first annular region and a second annular region that respectively surround the display region, the first annular region is sleeved to a side of the second annular region distal from the display region, the metal structure is disposed in the first annular region, and a gap exists between the metal structure and a film layer structure disposed in the second annular region;

the display substrate further includes a conductive structure disposed in the second annular region, the metal structure and the conductive structure are disposed on the same layer, and a preparation material of the metal structure is as same as that of the conductive structure;

a preparation material of the metal structure includes at least one of molybdenum, titanium, aluminum and silver;

a preparation material of the protective layer includes polyimide.

In a further aspect, there is provided a display panel including the display substrate, the display substrate has a display region and a non-display region disposed around the display region, and the display substrate includes a base substrate and a barrier structure disposed on a side of the base substrate; and wherein the barrier structure is disposed in the non-display region, the barrier structure includes a metal structure and a protective layer which are arranged on the substrate in sequence and the protective layer covers the metal structure.

In a further another aspect, there is provided a display apparatus, including the display panel as defined in the further aspect.

DETAILED DESCRIPTION

The present disclosure will be further described in detail with reference to the accompanying drawings, to present the objects, technical solutions, and advantages of the present disclosure more clearly.

An organic light emitting diode (OLED) display substrate is a flexible display substrate capable of proactively emitting light. The related art provides an OLED display substrate and an edge of the OLED display substrate is provided with a crack dam. The crack dam is configured to block a crack from extending to the inside of a display region of the OLED display substrate when the crack appears at the edge of the OLED display substrate. In the current OLED display substrate, the crack dam is generally an inorganic dielectric layer formed with silicon oxide, silicon nitride or the like.

However, since a film layer made of silicon oxide or silicon nitride has a poor anti-impact capability. When the edge of the OLED display substrate is subjected to external collisions or is twisted, a crack is apt to appear at the crack dam on the edge. If the crack extends to the inside of a display region of the OLED display substrate, package of the OLED display substrate may fail. In this case, moisture or oxygen and the like in the air may enter the inside of the OLED display substrate through the crack, and the internal organic light emitting material is caused to lose efficacy. As such, growing black spots (GDS) may occur on the OLED display substrate, such that quality of the display substrate is affected.

Figure 1:
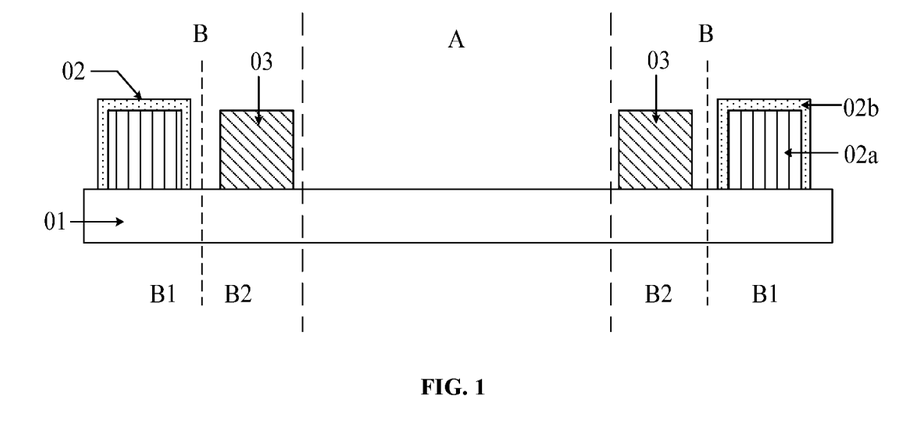
FIG. 1 is a schematic structural view of a display substrate according to an embodiment of the present disclosure.

FIG. 1 is a schematic structural view of a display substrate according to an embodiment of the present disclosure. As illustrated in FIG. 1, the display substrate has a display region A and a non-display region B disposed around the display region A. The display substrate includes a substrate 01 and a barrier structure disposed on a side of the substrate 01. The barrier structure 02 may also be referred to as a crack dam.

Referring to FIG. 1, the barrier structure 02 is disposed in the non-display region B. The barrier structure 02 includes a metal structure 02a and a protective layer 02b which are arranged on the substrate 01 in sequence. The protective layer 02b covers the metal structure 02a.

Optionally, the display substrate according to this embodiment of the present disclosure may be a flexible display substrate. A base substrate in the display substrate may be made of a flexible material. Optionally, the display substrate may be an OLED display substrate or a quantum dot light emitting diode (QLED) display substrate.

In summary, in the display substrate according to the embodiment of the present disclosure, the barrier structure disposed in the non-display region includes a metal structure made of a metal material and the metal structure is covered by a protective layer. When the edge of the display substrate is subjected to external impacts or is twisted, since the metal material has a high hardness, a good ductility and a strong anti-impact capability and the protective layer may have a certain buffer function, the metal structure is not apt to generate cracks, and thus the internal structure of the display substrate may be effectively protected, and a risk that GDS occurs may be decreased.

Optionally, the metal structure may be made of at least one of molybdenum (MO), titanium (Ti), aluminum (Al) and silver (Ag). That is, the preparation material of the metal structure includes at least one of molybdenum, titanium, aluminum and silver. Since the molybdenum has a high melting point which may reach 2620° C., the molybdenum has a good chemical stability, the hardness and the anti-impact capability of the metal molybdenum are also high, the metal structure in the barrier structure made of the molybdenum may ensure all of the structural stability, the hardness and the anti-impact capability of the barrier structure, and thus the internal structure of the display substrate may be effectively protected. Optionally, the preparation material of the metal structure may also include silicon (Si) and the specific preparation material of the metal structure is not limited in the embodiments of the present application.

Optionally, the protective layer may be made of organic materials. For example, the preparation material of the protective layer may include polyimide (PI).

Optionally, the metal structure includes at least one closed annular structure. That is, the metal structure includes one or a plurality of closed annular structures. Each closed annular structure surrounds the display region.

Figure 2:
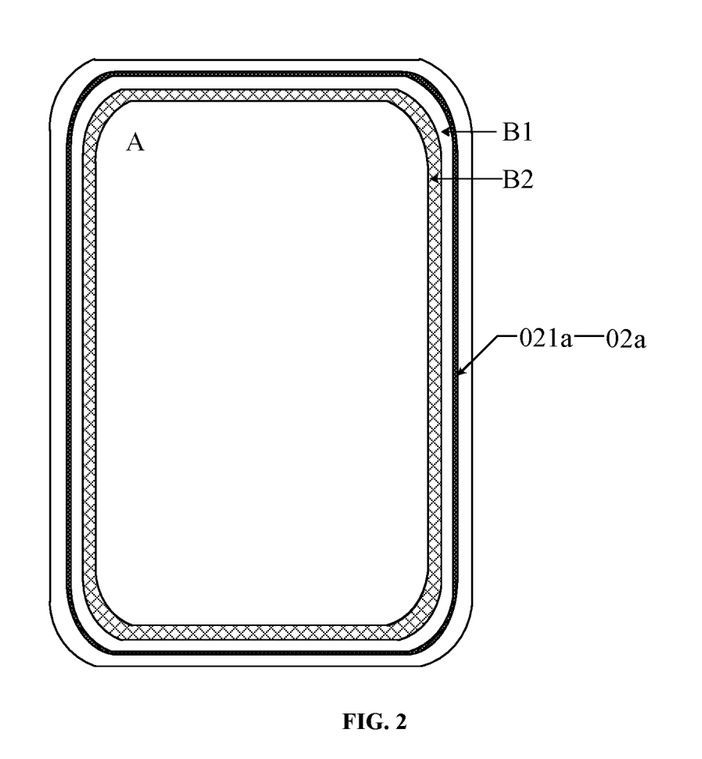
FIG. 2 is a top view of a display substrate according to an embodiment of the present disclosure.
Figure 3:
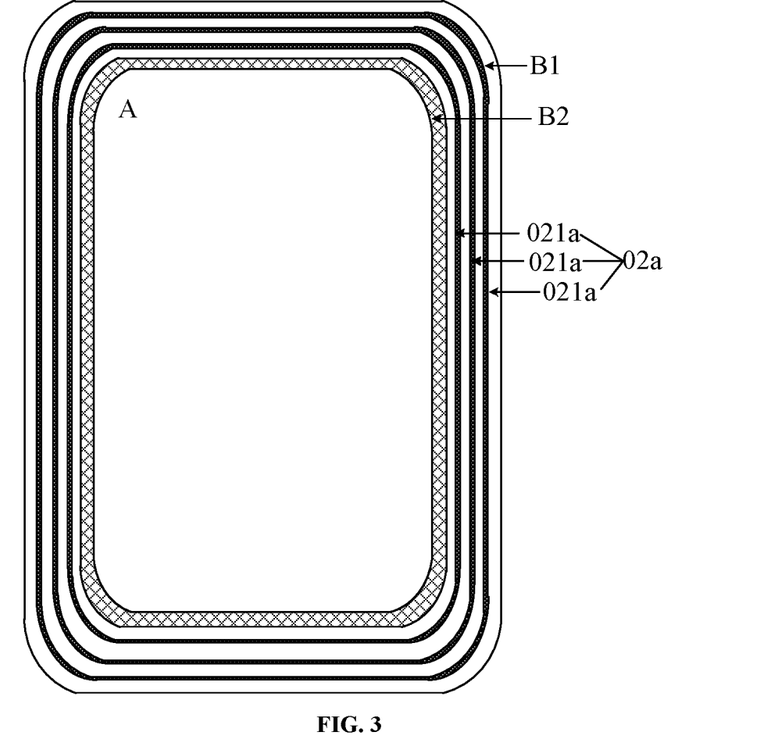
FIG. 3 is a top view of another display substrate according to an embodiment of the present disclosure.

Exemplarily, FIG. 2 is a top view of a display substrate according to an embodiment of the present disclosure. As illustrated in FIG. 2, the metal structure 02a includes a closed annular structure 021a. Further exemplarily, FIG. 3 is a top view of another display substrate according to an embodiment of the present disclosure. As illustrated in FIG. 3, the metal structure 02a includes a plurality of closed annular structures 021a arranged at intervals. For example, as illustrated in FIG. 3, the metal structure 02a includes three closed annular structures 021a arranged at intervals.

Optionally, a center of the closed annular structure may coincide with a center of the display region. Exemplarily, in the display substrate as illustrated in FIG. 3, the plurality of closed annular structures may share a common center point. That is, the center points of the plurality of closed annular structures may the same. The same point is the center point of the display region.

Optionally, when the metal structure includes a plurality of closed annular structures arranged at intervals, the plurality of closed annular structures may be arranged at equal intervals. That is, a spacing between any two adjacent closed annular structures is the same.

Optionally, a width of the closed annular structure ranges from 5 μm to 15 μm, and a height of the closed annular structure in a direction vertical to the base substrate ranges from 10 μm to 20 μm.

Optionally, referring to FIG. 1, the non-display region B includes a first annular region B1 and a second annular region B2 that respectively surround the display region A. The first annular region B1 is sleeved to a side of the second annular region B2 distal from the display region A. That is, the second annular region B2 is disposed between the display region A and the first annular region B1, and the display region A is disposed in a region enclosed by the second annular region B2. The display region A and the second annular region B2 may form a package region of the display substrate together.

Referring to FIG. 1, the barrier structure 02 is disposed in the first annular region B1, and a gap exists between the barrier structure 02 and a film layer structure 03 disposed in the second annular region B2.

It should be noted that since the gap exists between the barrier structure disposed in the first annular region and the film layer structure disposed in the second annular region, when the edge of the display substrate is subjected to external collisions or is twisted and thus the barrier structure generates the crack, the crack on the barrier structure cannot extend to the film layer structure disposed in the second annular region. That is, the crack on the barrier structure may not affect the structure in the package region of the display substrate. Therefore, package failures of the display substrate may be prevented, the GDS may be prevented from the display substrate, and the yield and quality of the display substrate are improved.

Optionally, the display substrate further includes a conductive structure disposed in the second annular region. That is, the film layer structure in the second annular region may include the conductive structure. The metal structure and conductive structure may be disposed in the same layer but arranged at intervals. The material of the barrier structure is the same as that of the conductive structure. That is, both the metal structure and the conductive structure may be made of the same metal material.

It should be noted that since the metal structure and the conductive structure are disposed in the same layer, the conductive structure and the metal structure that is disposed in the same layer but arranged at intervals with the conductive structure may be formed by a one-patterning process, and thus the manufacture cost and the complexity of the manufacture process of the display substrate may not be increased.

Optionally, the conductive structure disposed in the second annular region includes a gate wiring, and the metal structure and the gate wiring may be disposed in the same layer but arranged at intervals. The gate wiring is generally manufactured in the same layer with a gate in the display region. That is, the metal structure and the gate may be disposed in the same layer.

Optionally, the conductive structure disposed in the second annular region may also include a source and drain metal wiring or the other metal wiring layers, and the metal structure may be disposed in the same layer with any metal wiring layer in the conductive structure, which is not limited in the embodiment of the present disclosure.

Figure 4:
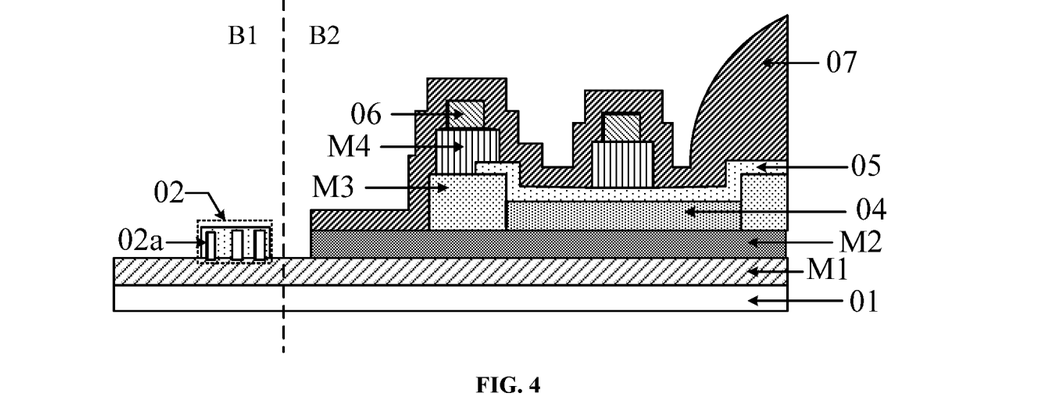
FIG. 4 is a schematic structural view of another display substrate according to an embodiment of the present disclosure.

Optionally, FIG. 4 is a schematic structural view of another display substrate according to an embodiment of the present disclosure. FIG. 4 only illustrates the film layer structure in the non-display region of the display substrate. As illustrated in FIG. 4, the second annular region B2 of the display substrate includes: a first insulation layer M1, a second insulation layer M2, a first metal wiring layer 04, a third insulation layer M3, a second metal wiring layer 05, a fourth insulation layer M4, a flexible material layer 06 and a package layer 07 that are disposed in sequence on the base substrate 01. The first metal wiring layer may be the gate wiring, and may be disposed in the same layer with the gate in the display region. The second metal wiring layer may be the source and drain wiring, and may be disposed in the same layer with the source and the drain in the display region. The first annular region B1 of the display substrate includes a barrier structure 02. The metal structure 02a in the barrier structure 02 and the first metal wiring layer 04 or the second metal wiring layer 05 may be disposed in the same layer. That is, the metal structure 02a and the first metal wiring layer 04 may be manufactured by a one-patterning process. Alternatively, the metal structure 02a and the second metal wiring layer 05 may be manufactured by a one-patterning process.

Optionally, in the display substrate as illustrated in FIG. 4, the first insulation layer may be an integral layer structure, or may be only disposed in the second annular region; and the second insulation layer may be an integral layer structure, or may be only disposed in the second annular region, which are not limited in the embodiment of the present disclosure.

In summary, in the display substrate according to the embodiment of the present disclosure, the barrier structure disposed in the non-display region includes a metal structure made of a metal material and the metal structure is covered by a protective layer. When the edge of the display substrate is subjected to external impacts or is twisted, since the metal material has a high hardness, a good ductility and a strong anti-impact capability and the protective layer may have a certain buffer function, the metal structure is not apt to generate cracks, and thus the internal structure of the display substrate may be effectively protected and a risk that GDS occurs may be decreased. In addition, since the gap exists between the barrier structure disposed in the first annular region and the film layer structure disposed in the second annular region, when the edge of the display substrate is subjected to external collisions or is twisted and thus the barrier structure generates the crack, the crack on the barrier structure cannot extend to the film layer structure disposed in the second annular region. That is, the crack on the barrier structure may not affect the structure in the package region of the display substrate. Therefore, package failures of the display substrate may be prevented, the GDS may be prevented from the display substrate, and the yield and quality of the display substrate are improved.

Figure 5:
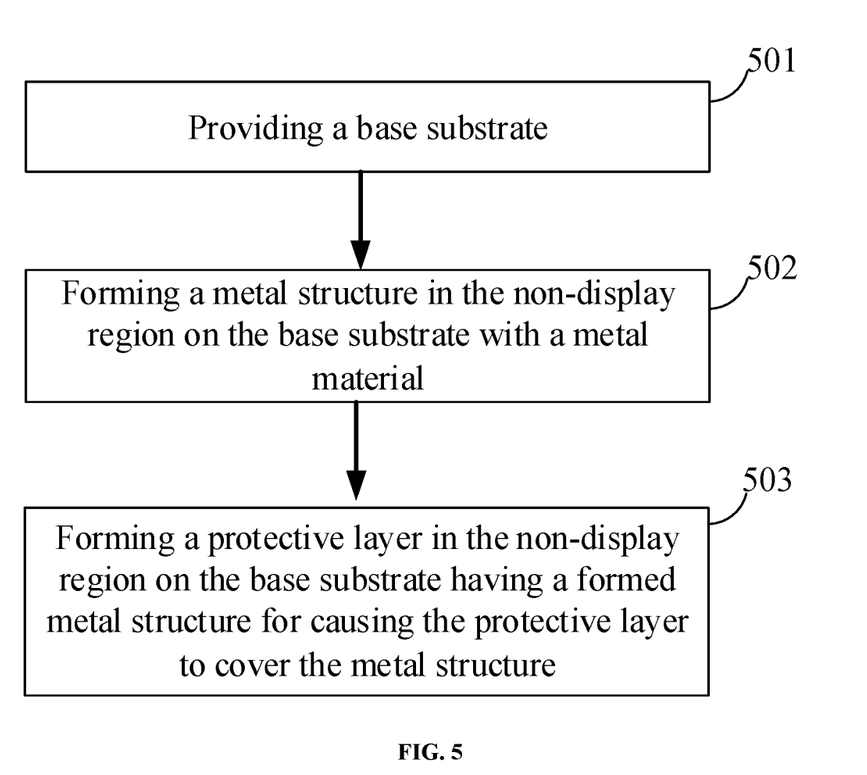
FIG. 5 is a flowchart of a method for manufacturing a display substrate according to an embodiment of the present disclosure.

FIG. 5 is a flowchart of a method for manufacturing a display substrate according to an embodiment of the present disclosure. The display substrate has a display region and a non-display region disposed around the display region. As illustrated in FIG. 5, the method may include the processes:

In step 501, a base substrate is provided.

In the embodiment of the present disclosure, the base substrate is used as a carrier for manufacturing a film layer structure. Optionally, the base substrate may be a flexible base substrate. For example, the base substrate may be manufactured with a PI material.

In step 502, a metal structure in the non-display region is formed on the base substrate with a metal material.

Optionally, the non-display region of the display substrate includes a first annular region and a second annular region that respectively surround the display region, and the first annular region is sleeved to a side of the second annular region distal from the display region. The metal structure is disposed in the first annular region, and a gap exists between the metal structure and a film layer structure disposed in the second annular region. In addition, the metal structure in the first annular region may be formed with a conductive structure in the second annular region (or the display region) by a one-patterning process.

In step 503, a protective layer is formed in the non-display region on the base substrate having a formed metal structure so that the protective layer covers the metal structure.

In the embodiments of the present disclosure, a structure formed by the metal structure and the protective layer covering the metal structure is called as a barrier structure.

In summary, in the method for manufacturing a display substrate according to the embodiment of the present disclosure, the metal structure is formed in the non-display region of the display substrate with the metal material. When the edge of the display substrate is subjected to external impacts or is twisted, since the metal material has a high hardness, a good ductility and a strong anti-impact capability and the protective layer covering the metal structure may have a certain buffer function, and thus the barrier structure is not apt to generate cracks, the internal structure of the display substrate may be effectively protected, and a risk that GDS occurs may be decreased.

Optionally, step 502 specifically includes: at least one closed annular structure is formed in the non-display region on the base substrate with the metal material and by a patterning process, and each of the at least one closed annular structure surrounds the display region. Optionally, a plurality of closed annular structures arranged at intervals may be formed in the non-display region of the base substrate with the metal material and by the patterning process.

In the embodiment of the present disclosure, the non-display region may include the first annular region and the second annular region that respectively surround the display region, and the first annular region is disposed on the side of the second annular region distal from the display region. The implement process of the step 502 may include: the metal structure is formed in the first annular region on the base substrate and a conductive structure is formed in the second annular region on the base substrate with the metal material and by a one-patterning process, and a gap exists between the metal structure and the conductive structure.

Optionally, the conductive structure includes a gate wiring, and thus the metal structure may be formed in the first annular region on the base substrate and the gate wiring may be formed in the second annular region on the base substrate with the metal material and by a one-patterning process, and a gap exists between the metal structure and the gate wiring.

It should be noted that forming the conductive structure and the metal structure in the barrier structure on the base substrate by the one-patterning process can prevent the manufacture cost and the complexity of the manufacture process from been increased, effectively protect the display substrate and improve the yield of the display substrate.

Optionally, the metal material may be at least one of molybdenum, titanium, aluminum and silver. The implement process of the step 502 may include: the metal structure is formed in the non-display region on the base substrate with at least one of molybdenum, titanium, aluminum and silver and by the patterning process. Optionally, the metal structure may be formed in the non-display region of the base substrate with molybdenum and by patterning process. Since the metal material of molybdenum has a high hardness and a strong anti-impact capability, the metal structure in the barrier structure made of the molybdenum can ensure all the structural stability, the hardness and the anti-impact capability of the barrier structure so as to realize an effective protection for the internal structure of the display substrate.

Figure 6:
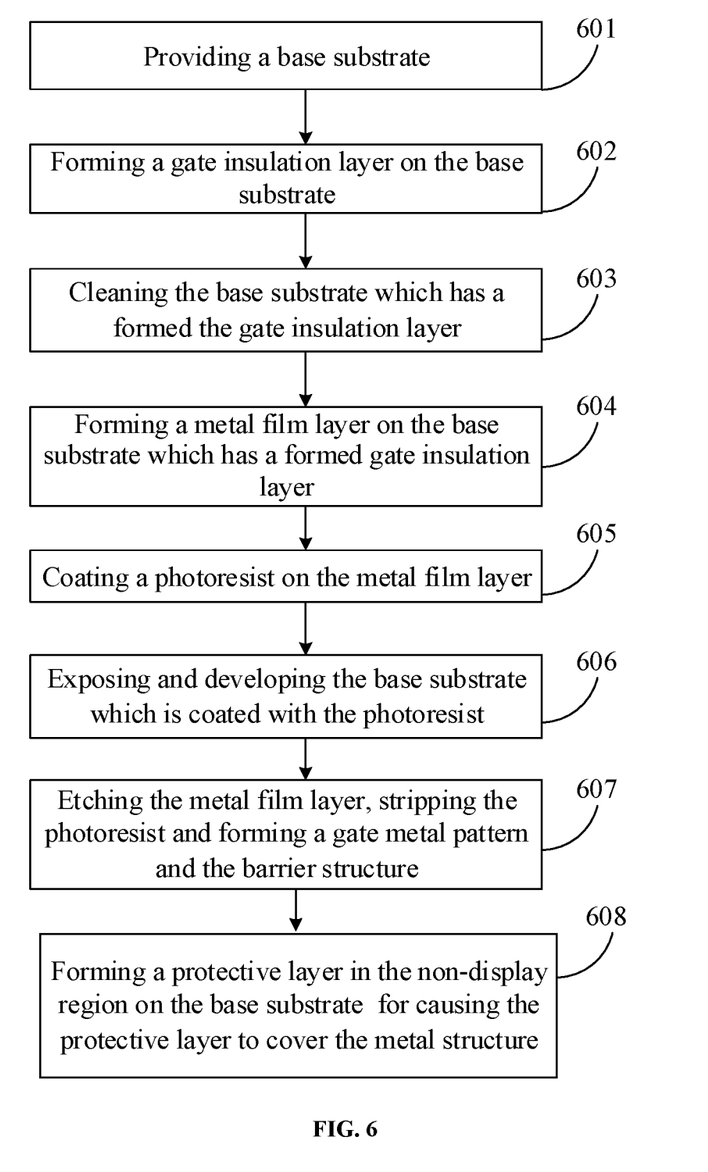
FIG. 6 is a flowchart of another method for manufacturing a display substrate according to an embodiment of the present disclosure.

FIG. 6 is a flowchart of another method for manufacturing a display substrate according to an embodiment of the present disclosure. It takes that the conductive structure is a gate wiring as an example, that is, it takes that the conductive structure and the gate wiring as well as the gate are formed by a one-patterning process as an example to describe the process of manufacturing a display substrate. As illustrated in FIG. 6, the method may include the following working processes:

In step 601, a base substrate is provided.

In the embodiment of the present disclosure, the base substrate is used as a carrier for manufacturing a film layer structure. Optionally, the base substrate may be a flexible base substrate. For example, the base substrate may be manufactured with a PI material.

In step 602, a gate insulation layer is formed on the base substrate.

Figure 7:
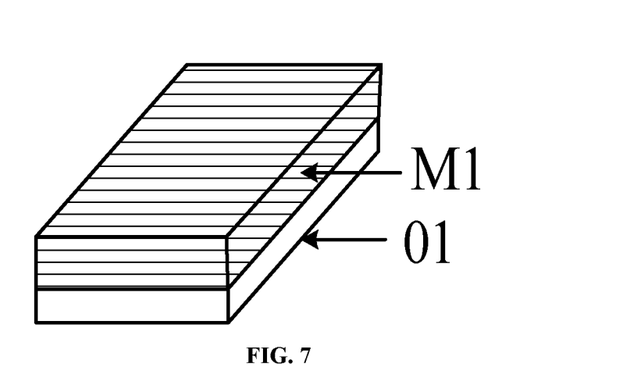
FIG. 7 is a schematic view showing that a gate insulation layer is formed according to an embodiment of the present disclosure.

Optionally, a first insulation layer M1 may be deposited on the base substrate 01 by a physical vapor deposition (PVD) process, wherein the first insulation layer M1 may be the gate insulation layer. FIG. 7 illustrates that the base substrate 01 is deposited with the gate insulation layer M1.

In step 603, the base substrate which has a formed the gate insulation layer is cleaned.

Optionally, after the gate insulation layer is formed, the display substrate may be cleaned with a hydrofluoric (HF) acid solution to improve an interface morphology of the display substrate.

In step 604, a metal film layer is formed on the base substrate which has a formed gate insulation layer.

Figure 8:
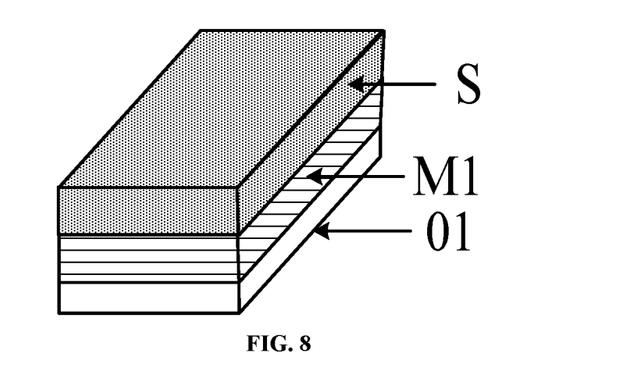
FIG. 8 is a schematic view showing that a metal film layer is formed according to an embodiment of the present disclosure.

In the embodiment of the present disclosure, a metal film layer S may be continuously deposited on a side of the gate insulation layer M1 away from the base substrate 01. For example, the metal film layer S may be deposited by magnetron sputtering. The metal film layer S may be made of molybdenum. The molybdenum has a high hardness, a good chemical stability and a strong anti-impact capability. FIG. 8 illustrates the base substrate 01 has a formed metal film layer S.

In step 605, a photoresist is coated on the metal film layer.

Figure 9:
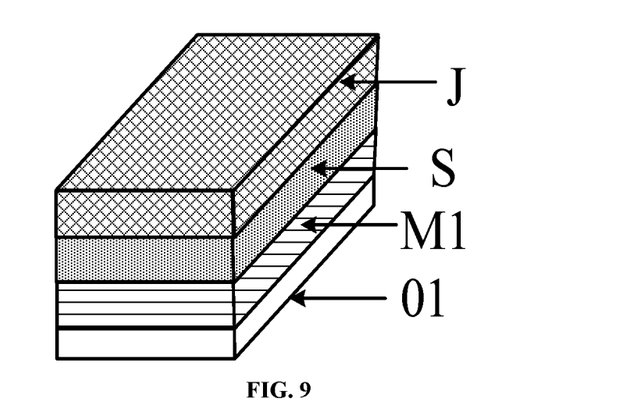
FIG. 9 is a schematic view showing that a photoresist is formed according to an embodiment of the present disclosure.

Optionally, the photoresist may be a photosensitive resin material. FIG. 9 illustrates the base substrate 01 is coated with a photoresist J.

In step 606, the base substrate which is coated with the photoresist is exposed and developed.

Figure 10:
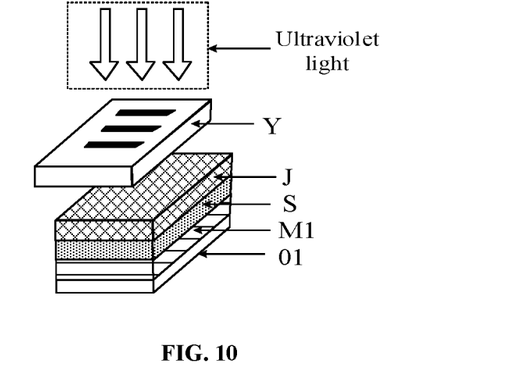
FIG. 10 is a schematic view showing that the photoresist is exposed according to an embodiment of the present disclosure.
Figure 11:
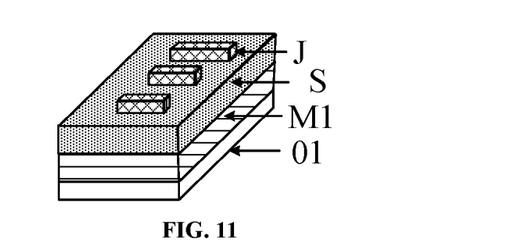
FIG. 11 is a schematic view showing that the photoresist is developed according to an embodiment of the present disclosure.

In the embodiment of the present disclosure, the base substrate 01 may be exposed with ultraviolet light via a mask plate Y. Exemplarily, FIG. 10 is a schematic view showing that the photoresist is exposed according to an embodiment of the present disclosure. The base substrate 01 may be exposed by the mask plate Y as illustrated in FIG. 10. FIG. 10 only illustrates a partial exposure pattern for forming the metal structure in the mask plate Y. When the metal structure is a closed annular structure, the exposure pattern in the mask plate Y for forming the metal structure is also a closed annular structure. Afterwards, the exposed base substrate 01 may be placed into a developing solution for development. FIG. 11 is a schematic view showing that the photoresist is developed according to an embodiment of the present disclosure.

In step 607, the metal film layer is etched, the photoresist is stripped and a gate metal pattern and the metal structure are formed.

The gate metal pattern includes the gate in the display region and the gate wiring in the non-display region (the second annular region).

Figure 12:
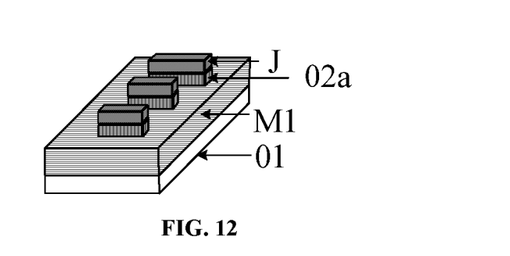
FIG. 12 is a schematic view showing that the photoresist is etched according to an embodiment of the present disclosure.
Figure 13:
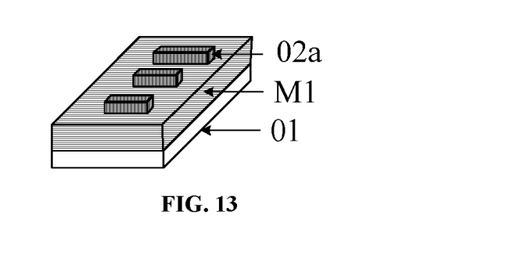
FIG. 13 is a schematic view showing that a metal structure is formed after stripping of the photoresist according to an embodiment of the present disclosure.

Exemplarily, FIG. 12 is a schematic view showing that the photoresist is etched according to an embodiment of the present disclosure. The part in the metal film layer 04 that is not covered by the photoresist may be etched, and the structure of the etched display substrate may be illustrated in FIG. 12. Further, the photoresist J may be stripped such that the gate metal pattern (not illustrated in the drawing) and the metal structure are obtained. FIG. 13 is a schematic view showing a partial structure of a display substrate according to an embodiment of the present disclosure. FIG. 13 illustrates a part of a metal structure 02a disposed in the non-display region of the display substrate. The metal structure 02a may be in an annular shape.

In the embodiment of the present disclosure, by the one-patterning process (which is also referred to as a backplane process, BP) in step 601 to step 607, the gate metal pattern and the metal structure 02a are formed, such that the manufacture cost and the complexity of the manufacture process of the display substrate may not be increased, and the metal structure 02a may effectively protect the display substrate.

In step 608, the protective layer is formed in the non-display region of the base substrate so that the protective layer covers the metal structure.

Optionally, the protective layer covering the metal structure may be formed with PI and by the patterning process.

It should be noted that in the method for manufacturing a display substrate according to the embodiment of the present disclosure, the sequence of the steps may be adaptively adjusted, and the steps may also be reduced or increased according to the actual needs. A person skilled in the art would readily envisage method variations without departing from the technical scope disclosed in the present disclosure, and these method variations shall all fall within the protection scope of the present disclosure, which are thus not described herein any further.

In summary, in the method for manufacturing a display substrate according to the embodiment of the present disclosure, the metal structure is formed in the non-display region of the display substrate with the metal material. When the edge of the display substrate is subjected external impacts or is twisted, since the metal material has a high hardness, a good ductility and a strong anti-impact capability and the protective layer covering the metal structure may have a certain buffer function, and thus the barrier structure is not apt to generate cracks, the internal structure of the display substrate may be effectively protected, and the risk that GDS occurs may be decreased. In addition, since the gap exists between the barrier structure disposed in the first annular region and the film layer structure disposed in the second annular region, when the edge of the display substrate is subjected to external collisions or is twisted and thus the barrier structure generates the crack, the crack on the barrier structure cannot extend to the film layer structure disposed in the second annular region. That is, the crack on the barrier structure may not affect the structure in the package region of the display substrate. Therefore, package failures of the display substrate may be prevented, the GDS may be prevented from the display substrate, and the yield and quality of the display substrate are improved.

An embodiment of the present disclosure provides a display panel. The display panel may include the display substrate as illustrated in any one of FIGS. 1 to 4. The display panel may be: a liquid crystal panel, an electronic paper, an OLED panel, an active matrix OLED (AMOLED) panel, a QLED panel, a mobile phone, a tablet computer, a television, a display, a laptop computer, a digital photo frame, a navigator or other product or part having a display function. The AMOLED panel may be a flexible display panel.

An embodiment of the present disclosure provides a display apparatus. The display apparatus includes the above described display panel.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display substrate having a display region and a non-display region disposed around the display region, wherein the display substrate comprises:

a base substrate and a barrier structure disposed on a side of the base substrate, wherein the barrier structure is disposed in the non-display region, and the barrier structure comprises a metal structure and a protective layer which are arranged on the base substrate in sequence and the protective layer covers the metal structure,
wherein the non-display region comprises a first annular region and a second annular region that respectively surround the display region, the first annular region is sleeved to a side of the second annular region distal from the display region, the metal structure is disposed in the first annular region, the second annular region comprises a first insulation layer, a second insulation layer, a gate wiring, a third insulation layer, a source and drain wiring, a fourth insulation layer, a flexible material layer and a package layer that are disposed in sequence on the base substrate, the metal structure and the gate wiring are disposed on the same layer and a gap exists between the metal structure and the gate wiring, and the gate wiring is not covered by the protective layer.

2. The display substrate according to claim 1, wherein the metal structure comprises a plurality of closed annular structures,
wherein the plurality of closed annular structures arranged at intervals; and/or the plurality of closed annular structures are arranged at equal intervals.

3. The display substrate according to claim 1, wherein the preparation material of the metal structure is the same as that of the gate wiring.

4. The display substrate according to claim 1, wherein a preparation material of the metal structure comprises at least one of molybdenum, titanium, aluminum and silver.

5. The display substrate according to claim 1, wherein the display substrate is an organic light emitting diode (OLED) display substrate or a quantum dot light emitting diode (QLED) display substrate.

6. The display substrate according to claim 2, wherein a width of each of the plurality of closed annular structures ranges from 5 µm to 15 µm, and a height of each of the plurality of closed annular structures in a direction vertical to the base substrate ranges from 10 µm to 20 µm.

7. The display substrate according to claim 2, wherein the metal structure and the conductive structure are disposed on the same layer, and a preparation material of the metal structure is as same as that of the conductive structure;
wherein a preparation material of the metal structure comprises at least one of molybdenum, titanium, aluminum and silver; and
wherein a preparation material of the protective layer comprises polyimide.

8. A method for manufacturing a display substrate, the display substrate having a display region and a non-display region disposed around the display region, the method comprising:
providing a base substrate;
forming a metal structure in the non-display region on the base substrate with a metal material; and
forming a protective layer in the non-display region on the base substrate having a formed metal structure for causing the protective layer to cover the metal structure,
wherein the non-display region comprises a first annular region and a second annular region that respectively surround the display region, the first annular region is sleeved to a side of the second annular region distal from the display region, the metal structure is disposed in the first annular region, the second annular region comprises a first insulation layer, a second insulation layer, a gate wiring, a third insulation layer, a source and drain wiring, a fourth insulation layer, a flexible material layer and a package layer that are disposed in sequence on the base substrate, the metal structure and the gate wiring are disposed on the same layer and a gap exists between the metal structure and the gate wiring, and the gate wiring is not covered by the protective layer.

9. The method according to claim 8, wherein forming the metal structure in the non-display region on the base substrate with the metal material comprises:
forming a plurality of closed annular structures in the non-display region on the base substrate with the metal material and by a patterning process, wherein each of the plurality of closed annular structures surrounds the display region.

10. The method according to claim 8, wherein forming the metal structure in the non-display region on the base substrate with the metal material comprises:
forming the metal structure in the first annular region on the base substrate and forming a conductive structure in the second annular region on the base substrate with the metal material and by a one-patterning process, wherein a gap exists between the metal structure and the conductive structure.

11. The method according to claim 10, wherein forming the metal structure in the first annular region on the base substrate and forming the conductive structure in the second annular region on the base substrate with the metal material and by the one-patterning process comprises:
forming the metal structure in the first annular region on the base substrate and forming the gate wiring in the second annular region on the base substrate with the metal material and by the one-patterning process.

12. The method according to claim 8, wherein forming the metal structure in the non-display region on the base substrate with the metal material comprises:
forming the metal structure in the non-display region on the base substrate with at least one of molybdenum, titanium, aluminum and silver and by a patterning process.

13. A display panel, comprising a display substrate, the display substrate has a display region and a non-display region disposed around the display region, and the display substrate comprises a base substrate and a barrier structure disposed on a side of the base substrate; and
wherein the barrier structure is disposed in the non-display region, the barrier structure comprises a metal structure and a protective layer which are arranged on the substrate in sequence and the protective layer covers the metal structure,
wherein the non-display region comprises a first annular region and a second annular region that respectively surround the display region, the first annular region is sleeved to a side of the second annular region distal from the display region, the metal structure is disposed in the first annular region, the second annular region comprises a first insulation layer, a second insulation layer, a gate wiring, a third insulation layer, a source and drain wiring, a fourth insulation layer, a flexible material layer and a package layer that are disposed in sequence on the base substrate, the metal structure and the gate wiring are disposed on the same layer and a gap exists between the metal structure and the gate wiring, and the gate wiring is not covered by the protective layer.

14. A display apparatus, comprising the display panel as defined in claim 13.

\* \* \* \* \*

UNITED STATES PATENT AND TRADEMARK OFFICE
CERTIFICATE OF CORRECTION

PATENT NO. : 11,805,668 B2
APPLICATION NO. : 16/879830
DATED : October 31, 2023
INVENTOR(S) : Haoming Lv It is certified that error appears in the above-identified patent and that said Letters Patent is hereby corrected as shown below:

On the Title Page

The Assignees item (73) should read:
CHENGDU BOE OPTOELECTRONICS TECHNOLOGY CO., LTD., SICHUAN, CHINA
BOE TECHNOLOGY GROUP CO., LTD., BEIJING, CHINA Signed and Sealed this
Second Day of January, 2024

Katherine Kelly Vidal
*Director of the United States Patent and Trademark Office*